(12) United States Patent
Srinivasan et al.

(10) Patent No.: US 11,550,348 B2
(45) Date of Patent: Jan. 10, 2023

(54) METHODS AND DEVICES FOR BYPASSING A VOLTAGE REGULATOR

(71) Applicant: STMicroelectronics International N.V., Geneva (CH)

(72) Inventors: Venkata Narayanan Srinivasan, Greater Noida (IN); Mayankkumar Hareshbhai Niranjani, Lathi (IN); Gourav Garg, Kaithal (IN)

(73) Assignee: STMicroelectronics International N.V., Geneva (CH)

( * ) Notice: Subject to any disclaimer, the term of this patent is extended or adjusted under 35 U.S.C. 154(b) by 52 days.

(21) Appl. No.: 17/211,545

(22) Filed: Mar. 24, 2021

(65) Prior Publication Data
US 2022/0308610 A1    Sep. 29, 2022

(51) Int. Cl.
*G05F 1/56*    (2006.01)
*G01R 31/28*    (2006.01)
*H03K 19/20*    (2006.01)

(52) U.S. Cl.
CPC ......... *G05F 1/562* (2013.01); *G01R 31/2856* (2013.01); *G01R 31/2896* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 8,896,370 B2 | 11/2014 | Pietri et al. | |
| 8,996,943 B2 | 3/2015 | Grossier et al. | |
| 9,690,344 B2 * | 6/2017 | Damle | G06F 1/3203 |
| 10,527,672 B2 | 1/2020 | Srinivasan et al. | |
| 10,747,282 B2 | 8/2020 | Srinivasan et al. | |
| 11,119,153 B1 * | 9/2021 | Srinivasan | G01R 31/31721 |
| 2019/0094296 A1 | 3/2019 | Srinivasan et al. | |
| 2021/0011080 A1 | 1/2021 | Narwal et al. | |

* cited by examiner

*Primary Examiner* — Jeffery S Zweizig
(74) *Attorney, Agent, or Firm* — Slater Matsil, LLP

(57) ABSTRACT

A method to bypass a voltage regulator of a system on a chip (SOC) comprising powering a first power domain using a voltage regulator; powering a second power domain using the voltage regulator; coupling a third power domain with an external voltage source; raising an external voltage supply from the external voltage source above a threshold level of the voltage regulator; coupling the first second power domains to the external voltage source; turning OFF the voltage regulator of the SOC after coupling the first power domain of the SOC and the second power domain of the SOC to the external voltage source; and powering the first power domain of the SOC, the second power domain of the SOC, and the third power domain of the SOC with the external voltage source, the external voltage source bypassing the voltage regulator.

22 Claims, 11 Drawing Sheets

METHODS AND DEVICES FOR BYPASSING A VOLTAGE REGULATOR

TECHNICAL FIELD

This application relates to methods and devices for bypassing a voltage regulator on a system on a chip.

BACKGROUND

Systems on a chip may support multiple power domains. Different power domains may utilize different voltages to power components within the respective power domain. It may be desirable to allow a power domain to switch between an internal voltage source and an external voltage source.

SUMMARY

In accordance with an embodiment, a method may include powering a first power domain of a system on a chip (SOC) using a voltage regulator of the SOC; powering a second power domain of the SOC using the voltage regulator of the SOC; coupling a third power domain of the SOC with an external voltage source; raising an external voltage supply from the external voltage source above a threshold level of the voltage regulator of the SOC; coupling the first power domain of the SOC and the second power domain of the SOC to the external voltage source; turning OFF the voltage regulator of the SOC after coupling the first power domain of the SOC and the second power domain of the SOC to the external voltage source; and powering the first power domain of the SOC, the second power domain of the SOC, and the third power domain of the SOC with the external voltage source, the external voltage source bypassing the voltage regulator.

In accordance with an embodiment, a system on a chip (SOC) includes: a voltage regulator; a first power domain configured to receive power from the voltage regulator; a second power domain; a third power domain configured to receive power from an external voltage supply coupled to the SOC; a first switch is configured to couple the first power domain to the second power domain when the first power domain is powered; a RUN switch that is configured to couple the second power domain to the third power domain when the second power domain and the third power domain are powered, the voltage regulator being configured to shut OFF when the run switch couples the second power domain to the third power domain; a voltage detector configured to trigger a reset of the SOC when a voltage-level signal for the third power domain exceeds the a maximum threshold level for the voltage regulator; and a test-mode pad or a test-mode pin that masks the reset when the test-mode pad or the test-mode pin is asserted.

In accordance with an embodiment, a testing system includes a device power source; a tester; and a system on a chip (SOC). The SOC includes a voltage regulator; a first power domain configured to receive power from the voltage regulator, the first power domain being coupled with the tester; a second power domain; a third power domain configured to receive power from the device power source; a first switch is configured to couple the first power domain to the second power domain when the first power domain is powered; a RUN switch that is configured to couple the second power domain to the third power domain when the second power domain and the third power domain are powered, the voltage regulator being configured to shut OFF when the run switch couples the second power domain to the third power domain; a voltage detector configured to trigger a reset of the SOC when a voltage-level signal for the third power domain exceeds the a maximum threshold level for the voltage regulator; and a test-mode pad or a test-mode pin that masks the reset when the test-mode pad or the test-mode pin is asserted.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
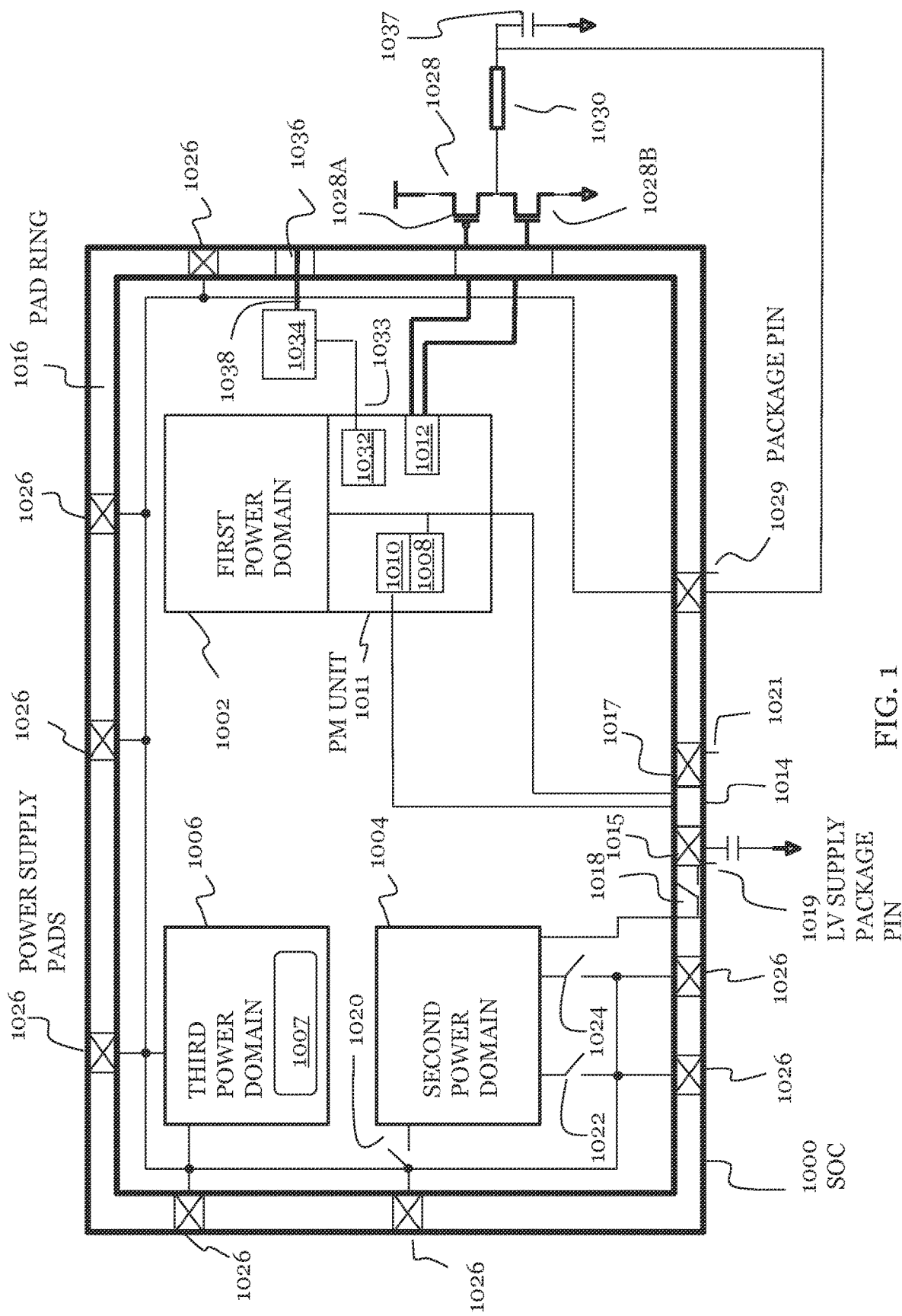
FIG. 1 depicts a system on a chip for bypassing a low voltage regulator of an embodiment.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured. Unless otherwise noted, features identified by the same number in different figures represent the same features.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Systems on a chip (SOCs) may use different voltage supplies for different components that operate at different voltage levels. For example, a SOC may have a high voltage ("HV") power supply, a medium voltage supply, and a low voltage supply.

In some cases, low voltage supply may be used for components that are critical to the operation of a device. Accurate and comprehensive testing of the components during production may be desirable. This may also be true of components on high voltage supply, medium voltage supply or another voltage supply.

The low voltage supply may be received from internal power sources. For example, a medium-voltage supply may receive power from a high-voltage supply. Similarly, a low-voltage supply may receive a power supply from the medium-voltage supply (in the case of a switched mode power supply) or external high-voltage supply (in the case of a second and first voltage regulators). Although, the high voltage supply may be received from an external source the medium voltage and low voltage are still considered to have received an internal supply. For example, an external source may supply 5V. The medium voltage domain may internally receive 1.8 V supplied by one or more regulators powered by the high-voltage supply. And, a low-power domain may internally receive 1 V internally from one or more regulators some powered by the MV (medium-voltage) supply and some powered by HV (high-voltage) supply.

Some SOCs may also allow domains on the low voltage supply to be switchable: supplied from internal and external sources. In some cases, low-voltage regulators that are powered internally may be bypassed to make way for an external supply to be coupled with the low power domains on the low power supply. Low power voltage regulators may be turned ON and OFF in response to a bypass selection signal. For example, a "1" on the low-voltage bypass selection signal may trigger the shutdown of the low-voltage regulators. As will be appreciated, in various embodiments, a "0" may not trigger the shutdown of the low-voltage regulators.

In some instances, voltage regulator may also be turned off by a voltage supply sequence. When a shutdown sequence is detected by the SOC, voltage regulators may be shutdown. For example, the SOC may be configured to shut down low voltage regulators when the SOC detects that low voltage supply is raised before a high-voltage supply and a medium voltage supply. This sequence indicates the availability of an external supply because it deviates from a typical startup sequence (where the high voltage is raised first which supplies the medium voltage, which, in turn, supplies a switched mode power supply providing low voltage. Low voltage regulators may be supplied from the high voltage supply. The shutdown sequence is controllable by an operator.

FIG. 1 depicts a SOC 1000 bypassing low voltage regulators.

The SOC 1000 may comprise a first power domain 1002, a second power domain 1004, and a third power domain 1006. Each of the first power domain 1002, the second power domain 1004, and the third power domain 1006 may be on a low-voltage supply. The SOC 1000 may also comprise other power domains or supplies (not depicted). In various embodiments, the SOC 1000 may also comprise a test controller 1007.

The first power domain 1002 may comprise an always ON domain. Once it is powered, it always remains ON. The first power domain 1002 may comprise an ultralow power domain. The first power domain 1002 may be on during a standby mode of the SOC 1000. The second power domain 1004 may be OFF during a standby mode of the SOC 1000, but may be powered during other modes of the SOC 1000. The second power domain 1004 may be powered during a low-power mode of the SOC. The third power domain 1006 may comprise a RUN switchable domain. The third power domain 1006 may be OFF during a low power mode of the SOC 1000. The third power domain 1006 may be OFF during the standby mode. And, the third power domain may be switchably ON or OFF at other times. In various embodiments, the test controller may be part of the third power domain 1006. This may be advantageous to avoid taxing resources of the first power domain 1002 and second power domain 1004.

The SOC 1000 may comprise a power management unit 1011. The power management unit 1011 may comprise a first voltage regulator 1008 and a second voltage regulator 1010. The first voltage regulator 1008 may comprise a linear voltage regulator. The second voltage regulator 1010 may comprise a linear voltage regulator. The power management unit 1011 may further comprise a switched mode power supply 1012 ("SMPS").

In various embodiments, the first power domain 1002 may be powered by the first voltage regulator 1008 during standby modes of the SOC 1000. The first voltage regulator may have its loop closed within the power management unit 1011. A ballast for the first voltage regulator may be located within the power management unit 1011.

A second voltage regulator 1010 may power the first power domain 1002 when the SOC is in a low power mode or other modes of operation other than a standby mode when all RUN switches (1020, 1022, 1024) are opened. The second voltage regulator 1010 may have a ballast 1014 located in a pad ring 1016 of the SOC (note ballast is internal to the pad rings so the numeral "1014" points to a location of the ballast 1014 in the pad ring 1016). The second voltage regulator 1010 may also power the second power domain 1004 during low power modes or during boots. A first switch 1018 may be used to couple the second power domain 1004 and the first power domain 1002 so the second voltage regulator 1010 may power both. As will be appreciated, additional switches may also be used for coupling the first power domain 1002 and the second power domain 1004. In various embodiments, the first voltage regulator 1008 is only ON during standby modes.

The SMPS 1012 may be configured to supply power to the first power domain 1002, the second power domain 1004, and the third power domain 1006 when it is ON. The SOC 1000 may comprise a RUN switch 1020 to couple the second power domain 1004 to the third power domain 1006 so the SMPS can supply both with a voltage. In various embodiments, the SOC 1000 may comprise additional switches for coupling the second power domain 1004 to the third power domain 1006. For example, second and third RUN switches (RUN switch 1022 and RUN switch 1024) may also be used. It should be appreciated that, in various embodiments, there may be more RUN switches. The RUN switches may be closed once the SMPS 1012 is powered. And, when the first switch 1018 is also closed, the SMPS may power the third power domain 1006, the second power domain 1004 (through the RUN switches), and the first power domain (by the first switch 1018). The second voltage regulator 1010 may be turned OFF when the SMPS powers the second power domain 1004, and the first power domain 1002

In various embodiments, the first switch 1018 (and any additional switches coupling the first power domain 1002 and the second power domain 1004) and the RUN switch 1020 (and any additional RUN switches) may be operated by the test controller 1007. In various embodiment, the first switch 1018 (and any additional switches coupling the first power domain 1002 and the second power domain 1004) and the RUN switch 1020 (and any additional RUN switches) may be configured to be closed when there is no high voltage supply available to the SOC 1000. The first voltage regulator 1008 and the second voltage regulator 1010 may also be turned ON and OFF by the test controller 1007.

The pad ring 1016 may comprise multiple power supply pads 1026 in the third power domain 1006 and multiple low voltage power supply pads in the first power domain 1002. The ballast 1014, in various embodiments may comprise a power supply pad 1015 and a pad 1017. The power supply pad 1015 may be coupled with a low voltage supply package pin 1019. The pad 1017 may be coupled with a high voltage supply package pin 1021. In various embodiments, the first power domain 1002 may comprise additional ballasts and additional pads. Additional pads may be coupled with the low voltage supply package pin 1019 or the high voltage supply package pin 1021. The low voltage supply package pin 1019 may be coupled to the power supply pad 1015 though a power bar. Similarly, the high voltage supply package pin 1021 may be coupled to pad 1017 through the power bar.

The first power domain 1002 may receive power from power supply pads 1015 for the first power domain 1002. And, the third power domain 1006 may receive power from power supply pads 1026 for the third power domain 1006. The second power domain 1004 receive power through the first power domain 1002, through the third power domain 1006, or through both the first power domain 1002 and the third power domain 1006 depending on the arrangement the first switch 1018, and the RUN switches. For example, when only the first switch 1018 (or switches) is closed, the second power domain 1004 may receive power through the first power domain 1002. When the RUN switches are closed the second power domain 1004 may receive power from the third power domain 1006. And, when both the first switch 1018 (or switches) and the RUN switches are closed, the second power domain 1004 may receive power from both the first power domain 1002 and the third power domain 1006.

In various embodiments, a ballast 1028 for the SMPS 1012 may be external to the SOC 1000. In this way, the SOC 1000 may need to be paired an off-chip components to close the loop for the SMPS 1012. Off chip components may include a ballast 1028, inductor 1030, and capacitor 1037. When paired with the appropriate off-chip components, the SMPS 1012 may provide a voltage supply at package pin 1029 which in turn connected a power bar to all power supply pads 1026 to power the third power domain 1006, and when the first switch 1018 and RUN switches are closed, the first power domain 1002 and the second power domain 1004. Package pin 1029 may be coupled to a power bar connection between the PACKAGE and DIE of the SOC 1000.

Figure 2:
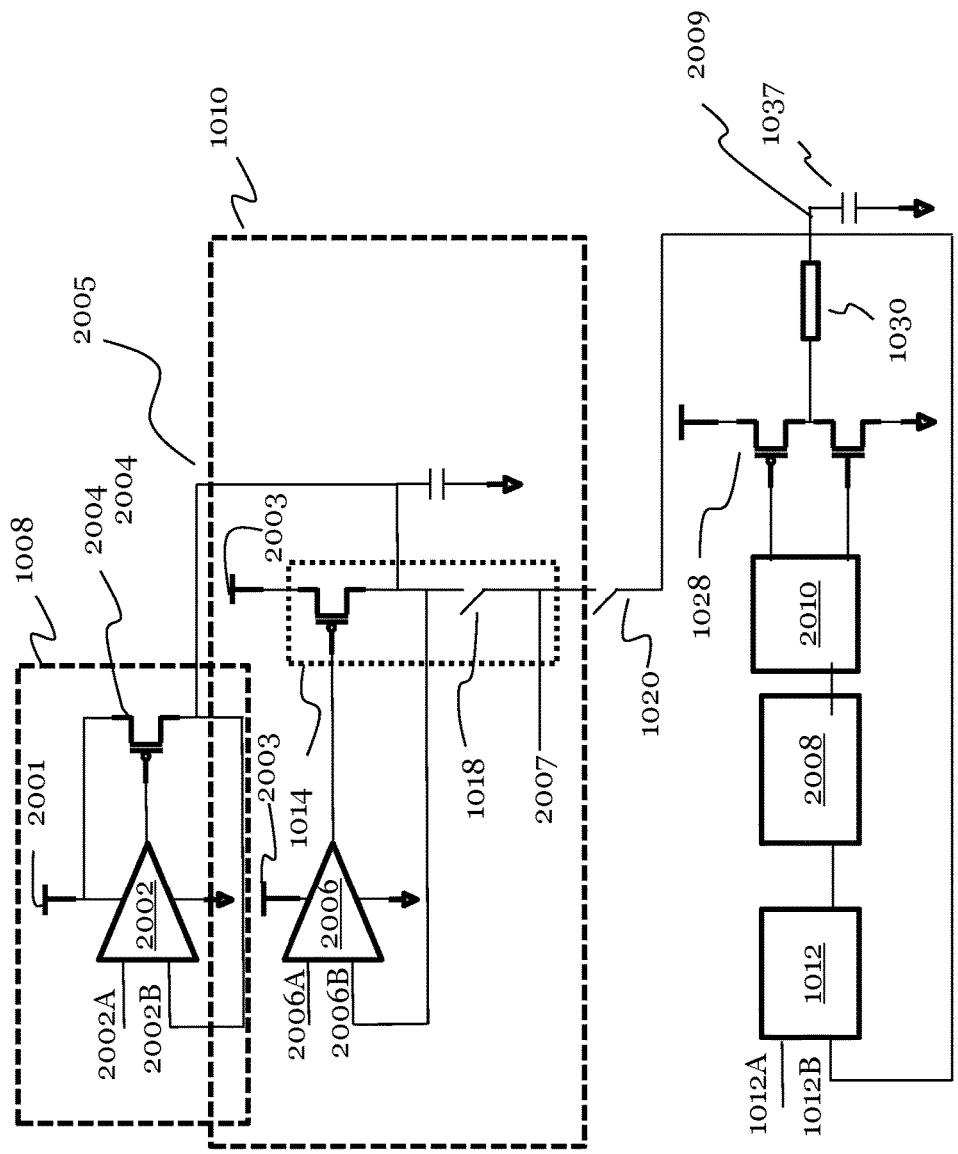
FIG. 2 depicts a first low voltage regulator, a second low voltage regulator, and a switched mode power supply of a system on a chip of an embodiment.

FIG. 2 depicts a first low voltage regulator, a second low voltage regulator, and a switched mode power supply of a system on a chip of an embodiment.

The first voltage regulator 1008 may comprise an op amp 2002. The op amp may receive a reference voltage at a first input poll 2002A. In various embodiments, the reference voltage may comprise 920 mV. However, it will be appreciated that the magnitude of the reference voltage received at the first input port 2002A may be different in various embodiments. The op amp 2002 may also receive feedback at a second port 2002B. The op amp 2002 may receive a voltage Vddhv at 2001 when powered. Vddhv may be received from the high-voltage supply for the SOC 1000. The first voltage regulator 1008 may also comprise a transistor 2004. The voltage at a node 2005 of the voltage regulator may be supplied to power the first power domain 1002.

The second voltage regulator 1010 may comprise an op amp 2006. The op amp may receive a reference voltage at a first input port 2006A. In various embodiments, the reference voltage may comprise 950 mV. However, it will be appreciated that the magnitude of the reference voltage received at the first input port 2006A may be different in various embodiments. The op amp 2006 may also receive feedback at a second port 2006B. The op amp 2006 may receive a voltage Vddhv at 2003. Vddhv may be received from the high voltage supply for the SOC 1000. The second voltage regulator 1010 may also comprise ballast 1014. The ballast may be located in the pad ring 1016 of the SOC. The first switch 1018 may be opened and closed to pair the second voltage regulator 1010 with the second power domain 1004. The voltage at node 2007 of the voltage regulator may be supplied to power the second power domain 1004.

The SMPS 1012 may be coupled with a driver 2008 and a circuit 2010 to protect the input/output from electrostatic discharge. The driver 2008 may be part of the SMPS 1012. The SMPS 1012 may comprise an input to receive a reference voltage at a first port 1012A. In various embodiments, the reference voltage may comprise 980 mV. In various embodiments, the reference voltage may be different. The SMPS 1012 may be powered by from the medium voltage supply. The SMPS 1012 may also receive feedback at a second port 1012B. As discussed with reference to FIG. 1, the ballast 1028, inductor 1030, and capacitor 1037 for closing the SMPS 1012 loop may be located off chip. In various embodiments, the inductor may comprise 4.7 µH and the capacitor may comprise 50 µF. The size of these components may be different in various embodiments. The off-chip components may be needed to close the loop for the SMPS 1012.

The SMPS 1012 may supply a voltage to the third power domain 1006 at node 2009. A RUN switch 1020 may also couple the SMPS 1012 with the second power domain 1004 when the RUN switch 1020 is closed. Any additional run switches, such as RUN switch 1022, and RUN switch 1024, are also closed to couple the SMPS with the second power domain 1004. When the RUN switch is closed SMPS may provide power to the second power domain 1004 at node 2007. When the first switch 1018 is also closed, the SMPS may be coupled with the first power domain 1002 to supply a voltage to the first power domain 1002 at node 2005. Any additional first switches (also referred to as LP switches) are also closed.

Returning the FIG. 1, the SOC 1000 may further comprise a voltage detector circuit 1032. In various embodiments, the power management unit may 1011 comprise the voltage detector circuit 1032. The voltage detector circuit 1032 may be configured to detect when voltages provided by the first voltage regulator 1008, the second voltage regulator 1010, or the SMPS 1012 exceed upper or lower limits. The limits may differ for the different regulators. Each of the first voltage regulator 1008, the second voltage regulator 1010, and the SMPS 1012 may have their own target voltage range with their own upper and lower limits. For example, the upper limit for the SMPS regulator may be 1.06 V, the upper limit for the second voltage regulator may be 1.03 V, and the upper limit for the first voltage regulator may be 1.00 V. The lower limits for each of the regulators also vary from one regulator to other. If the upper limit for any of the regulator is exceeded, the voltage detector circuit 1032 may trigger a reset. The same may be true if the voltage falls below the lower limit.

In various embodiments, the SOC 1000 may comprise a minimum voltage detector, a low voltage detector, a high voltage detector and an upper voltage detector. The voltage detector circuit 1032 may comprise the minimum voltage detector, the low voltage detector, the high voltage detector and the upper voltage detector.

Figure 10:
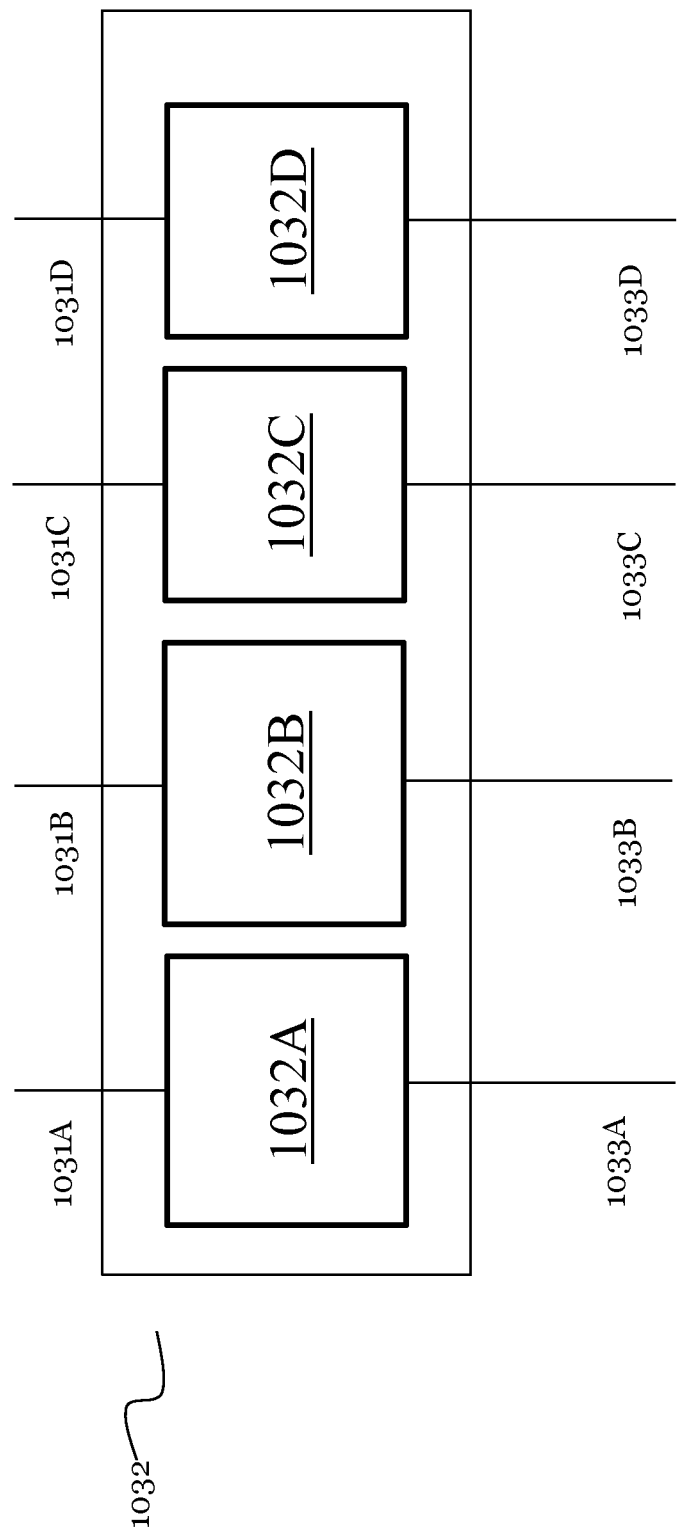
FIG. 10 depicts an embodiment of the voltage detector circuit 1032.

FIG. 10 depicts an embodiment of the voltage detector circuit 1032.

The voltage detector circuit 1032 may comprise a minimum voltage detector 1032A, a low voltage detector 1032B, a high voltage detector 1032C, and an upper voltage detector 1032D. The minimum voltage detector 1032A may comprise an input 1031A to receive a voltage level from the second voltage regulator 1010. The low voltage detector 1032B may comprise an input 1031B to receive a voltage level from the second voltage regulator 1010. The high voltage detector 1032C may comprise an input 1031C to receive a voltage level from the second voltage regulator 1010. The upper voltage detector 1032D may comprise an input 1031D to receive a voltage level from the second voltage regulator 1010.

The minimum voltage detector 1032A may comprise an output 1033A. The value of the output 1033A may depend on whether the voltage level of the second voltage regulator 1010 falls above or below a minimum voltage threshold. The low voltage detector 1032B may comprise an output 1033B. The value of the output 1033B may depend on whether the voltage level of the second voltage regulator 1010 falls above or below a low voltage threshold. The high voltage detector 1032C may comprise an output 1033C. The value of the output 1033C may depend on the whether the voltage level of the second voltage regulator 1010 falls above or below a high voltage threshold. The upper voltage detector 1032D may comprise an output 1033D. The value of the output 1033D may depend on whether the voltage level of the second voltage regulator 1010 falls above or below an upper voltage threshold.

The output 1033A, output 1033B, output 1033C, and output 1033D may be coupled with a logic circuit (or circuits) that triggers action depending on the outputs. Action may include a reset if the upper voltage threshold is exceeded. In various embodiments, the voltage detector circuit 1032 may comprise a minimum voltage detector that receives a voltage level from the first voltage regulator 1008. In various embodiments, the voltage detector circuit 1032 may comprise a low voltage detector that receives a voltage level from the first voltage regulator 1008. In various embodiments, the voltage detector circuit 1032 may comprise a high voltage detector that receives a voltage level from the first voltage regulator 1008. In various embodiments, the voltage detector circuit 1032 may comprise an upper voltage detector that receives a voltage level from the first voltage regulator.

In various embodiments, the voltage detector circuit 1032 may comprise a minimum voltage detector that receives a voltage level from the SMPS 1012. In various embodiments, the voltage detector circuit 1032 may comprise a low voltage detector that receives a voltage level from the SMPS 1012. In various embodiments, the voltage detector circuit 1032 may comprise a high voltage detector that receives a voltage level from the SMPS 1012. In various embodiments, the voltage detector circuit 1032 may comprise an upper voltage detector that receives a voltage level from the SMPS 1012. These additional voltage detectors may also output data dependent on respective threshold levels to a logic circuit to take corrective actions. The voltage detectors may also be used to determine when to couple the power domains. For example, all RUN switches may be closed to couple the third power domain 1006 with the second power domain 1004 after the low voltage threshold for the SMPS 1012 or (or external supply) crosses the respective low voltage threshold. After which, the second voltage regulator 1010 may be turned off.

Figure 3:
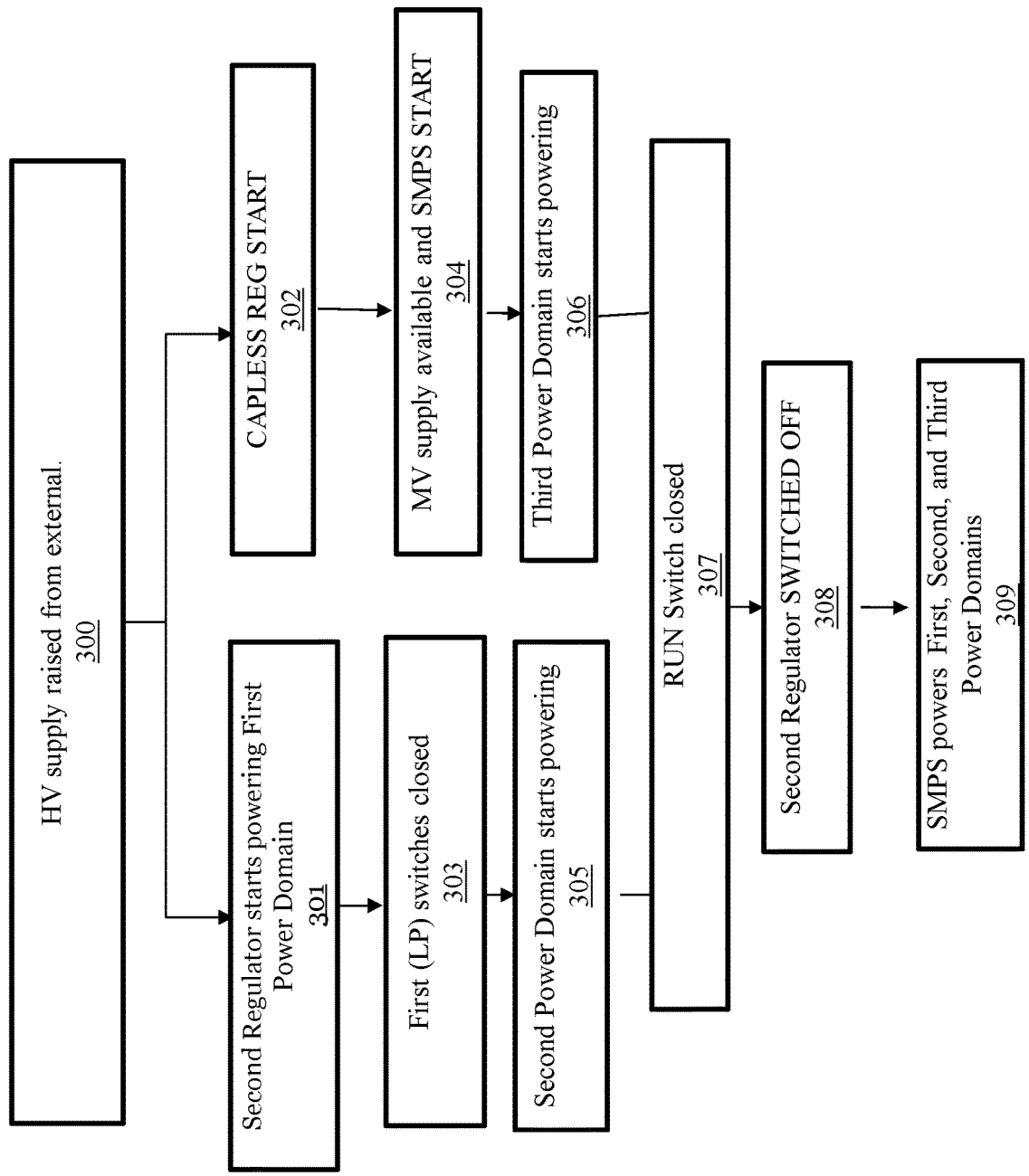
FIG. 3 depicts a known sequence to internally supply a low voltage supply for the first power domain, the second power domain, and a third power domain on a system on a chip.

FIG. 3 depicts a known sequence to internally supply a low voltage supply for the first power domain 1002, the second power domain 1004, and a third power domain 1006 on a SOC 1000.

At a first step 300, the high voltage supply may be raised from an external voltage source. The external voltage supply may be provided by a tester coupled with the SOC. The supply sequence may then proceed along two parallel paths. On a first path at step 301, the second regulator may start powering the first power domain 1002. At a step 303, the first switch 1018 (the low power or "LP" switch or switches) may be closed. This may couple the second power domain with first power domain 1002 and provide a path for the second voltage regulator 1010 to power the second power domain 1004 at step 305.

Along the second of the parallel paths, at step 302, an internal capless regulator may begin to operate, and at a step 304 may provide a medium voltage ("MV") supply. This allows the SMPS 1012 to begin to supply a voltage. And, at step 306, the third power domain 1006 may start powering.

The paths of the sequence converge at step 307, when the RUN switch 1020 is closed. Any additional switches, for example, RUN switch 1022 and RUN switch 1024, that couple the third power domain 1006 with the second power domain 1004 are also closed at step 307. At this point, the second voltage regulator 1010 is switched OFF at step 308. The switches and the second voltage regulator may be turned ON and OFF by a controller. And, at step 309, the SMPS 1012 powers the first power domain 1002, the second power domain 1004, and the third power domain 1006.

Testing for a SOC 1000 may be performed at different points during the production process. This may require powering up SOC components and running tests to determine performance. Electronic Wafer Sort ("EWS") tests may be performed on dies before they are assembled into packages. And, after package assembly, Final Testing ("FT") (Package Testing) may be performed on an assembled package. Tests may be performed with a tester. A tester may be coupled with pads or pins of the dies or packages to supply test voltages, currents, loads and measure the response of the SOC 1000. The SOC 1000 may be tested over a range of different temperatures, voltages and other conditions.

The testing procedure may consume time and resources so efforts to test dies and packages in parallel are advantageous to promote efficiency, production pace, and reduce costs. The degree of parallelism that may be achieved may vary depending on the type of test being performed during wafer sort testing. And, likewise, it may be desirable to test multiple packages in parallel for Final Testing. The degree of parallelism achievable for Final Testing may also vary depending on the test being performed during Final Testing.

Reducing the number of pads of a die or pins of package that need to be coupled with a tester during the various tests may help increase the level parallelism achievable during the tests. For example a tester with 1.536 k channels can test up to 32 devices simultaneously if tests are performed using only 48 pads or pins. If 64 couplings between a 1.536 K tester and a device are needed to perform a test, the maximum parallelism for the test is reduced to 24 devices. Pins or pads on a device under test that are not connected to tester channels may be left floating or connected to GND or VDD at the tester.

For testing purposes, it also may be advantageous to supply the low voltage to a SOC 1000 from an external source rather than internally. This may allow a test operator more control over the voltage level received, which can facilitate more accurate, and a wider range of testing.

In various embodiments, all the internal LV supply regulators (for example, second voltage regulator 1010, first voltage regulator 1008, and SMPS 1012) may be turned OFF by asserting a bypass signal. The bypass signal may be asserted by a pin when a SOC 1000. However, as discussed above, is may be desirable to leave pins unconnected to a tester to promote parallel testing. Additionally, not all embodiments of a SOC 1000 may comprise a bypass selector. Further, a tester used for EWS testing may not include the off-chip components needed to complete the loop for the SMPS 1012. This can reduce costs associated with testing. However, it may render the SMPS 1012 inoperable during EWS testing unless another voltage supply is provided. Other approaches for bypassing a voltage regulator on a SOC 1000 are, thus, needed.

As discussed with reference to FIG. 1, a SOC 1000 may be configured to allow a single voltage source to power the first power domain 1002, the second power domain 1004, and the third power domain 1006 through operation of the first switch 1018 (and any additional LP switches) and the RUN switch 1020 (and any additional RUN switches like RUN switch 1022 and RUN switch 1024). For example, when the SMPS is operating, an external low power supply may also utilize the same pathways to power the other domains on the low power supply (the first power domain 1002 and the second power domain 1004). However, it may be problematic to power the first power domain 1002, the second power domain 1004, and the third power domain 1006 just from supply pads of the first power domain 1002. There may not be enough supply pads for the first power domain 1002 to supply enough current for the entire device.

It also may be problematic to power the first power domain 1002, the second power domain 1004, and the third power domain 1006 just from the third power domain 1006. Although, there may be enough supply pads for the third power domain 1006 in the pad ring 1016 to supply all the domains on the low voltage supply, the switches that open and close the pathways between the power domains may need the first power domain 1002 to be powered to operate the switches so third power domain 1006 can provide a voltage to each of the power domains on the low voltage supply. So, the first power domain 1002, may need to be powered from another source so the switches may be closed that allow the first power domain 1002 to receive power from the third power domain 1006. Known methods for bypassing the voltage regulator for testing, thus, provide an external voltage supply through both the first power domain 1002 and the third power domain 1006.

Figure 4:
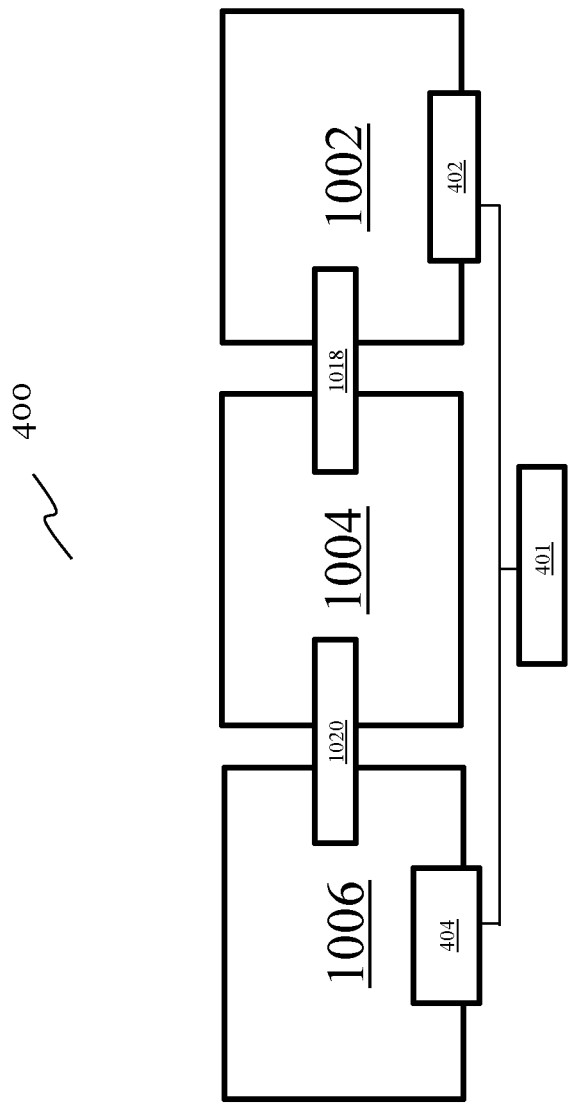
FIG. 4 shows a known system to provide external power to a system on a chip during testing.

FIG. 4 shows a known system 400 to provide external power to a SOC during testing.

FIG. 4 depicts the first power domain 1002, the second power domain 1004 and the third power domain 1006 of a SOC 1000. The first power domain 1002, the second power domain 1004 and the third power domain 1006 may all be on a low-voltage supply. A device power source 401 may provide an external low voltage to the first power domain 1002 at 402. The first power domain 1002 may be linked to the device power source 401 through power supply pads 1015 on the pad ring 1016 of the SOC 1000. Once the first power domain 1002 is powered, the first switch 1018 (or switches) is closed to link the first power domain 1002 and the second power domain 1004 to allow voltage to be supplied to the second power domain 1004. The RUN switch 1020 (and any additional switches such as RUN switch 1022 and RUN switch 1024) are also closed after the first power domain 1002 is powered.

The device power source 401 may also be coupled to the third power domain 1006 at 404. This coupling may be accomplished by power supply pads 1026 for the third power domain 1006 in the pad ring 1016. The device power source 401 can supply a voltage to power the third power domain 1006.

The linking of the device power source 401 and the first power domain 1002 at 402 allows the first power domain 1002 to be powered so that the switches may be closed to couple the domains. And, the coupling between the third power domain 1006 and the device power source 401 at 404 may provide enough pads to supply the all three domains from the external power source, the device power source 401. After the switches are closed, the second power domain 1004 is supplied through both the first power domain 1002 from 1015 pads (as first switch 1018 and additional LP switches, if any, are closed) and through the third power domain 1006 from 1026 pads (as RUN switches 1020, 1022, 1024 and additional RUN switches if any are closed).

However, providing an external low voltage supply through both the first power domain 1002 and the third power domain 1006 has limitations. For example, the aforementioned approach makes it not possible to perform closed loop trimming on the first voltage regulator 1008 and the second voltage regulator 1010 because you cannot check the voltage at the supply 402 as it is being supplied by the device power source 401. This may be undesirable because open loop trimming is not as accurate as closed loop trimming. Also, load regulation of the first voltage regulator 1008 and the second voltage regulator 1010 is not possible when the device power source 401 provides the voltage supply to the first power domain 1002 and the second power domain 1004. This is because you cannot couple a load at 402 because the voltage supply is coupled there. The providing an external low voltage supply through both the first power domain 1002 and the third power domain 1006 also limits current detection tests performed on the second voltage regulator 1010. The ability to perform power switch testing is also limited when first power domain 1002 and second power domain are powered from the device power source 401 because there is no external load and no internal current sink. Likewise, a consumption test may not be performed on the of the first power domain 1002 and the second power domain 1004 together, and a consumption test may not be performed on the first power domain 1002 by itself.

Coupling the first power domain 1002 and the third power domain 1006 with the device power source 401 also creates complications for Final Testing on a SOC 1000 that is performed after the assembly.

Figure 5:
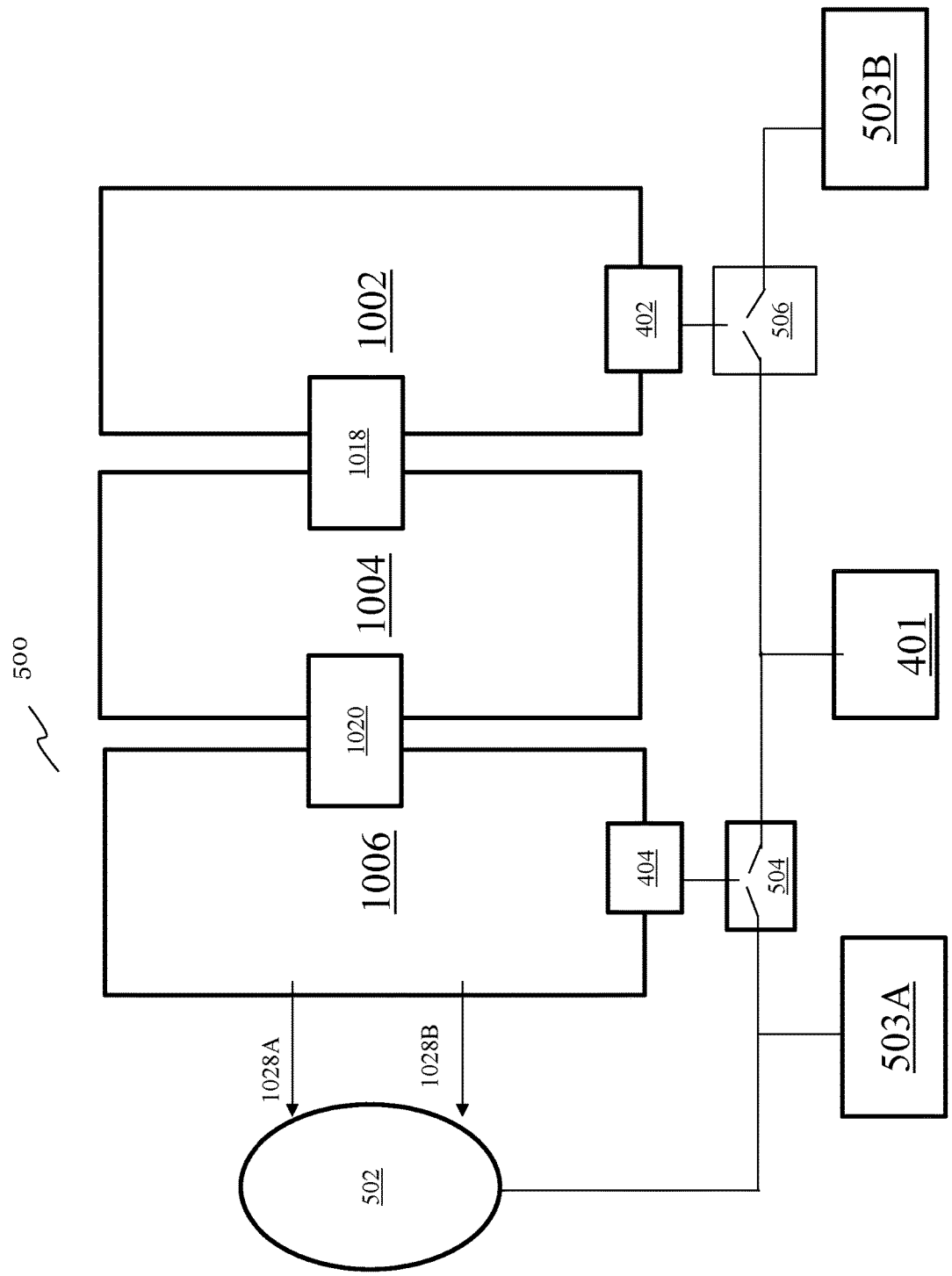
FIG. 5 depicts a known system for performing a Final Test on a system on a chip coupled with a device power source.

FIG. 5 depicts a system 500 for performing a Final Test on a SOC coupled with a device power source.

For FT testing a tester setup 502 may have the off chip components to complete the loop for the SMPS 1012. The tester setup may receive input from the SOC 1000 for a PMOS 1028A of the ballast 1028 and for an NMOS 1028B of the ballast 1028. A tester setup 502 with the off chip components supplied by the high voltage supply (VDDHV), the SOC may operate using internal voltage supply.

However, the structure needs to be in place to provide both internal and external voltage supply. In known methods, a first relay 504 may disposed between the device power source 401, tester setup 502 with off chip components, test equipment 503A and the third power domain 1006, and a second relay 506 may be disposed between the device power source 401, test equipment 503B and the first power domain 1002. When the SOC is externally powered, the first relay 504 and the second relay 506 may be closed to couple the device power source 401 with the first power domain 1002 at 402 and the third power domain 1006 at 404. When the low voltage supply for the first power domain 1002, the second power domain 1004 and the third power domain is supplied by the SMPS 1012, the first relay 504 may be open to device power source 401 but closed to couple the tester setup 502 (including off chip components) and test equipment 503A with the third power domain 1006 at 404. The second relay may be open to the device power source 401 but closed to couple the test equipment 503B with the first power domain 1002 at 402. It would be advantageous to eliminate the one of the relays.

Figure 6:
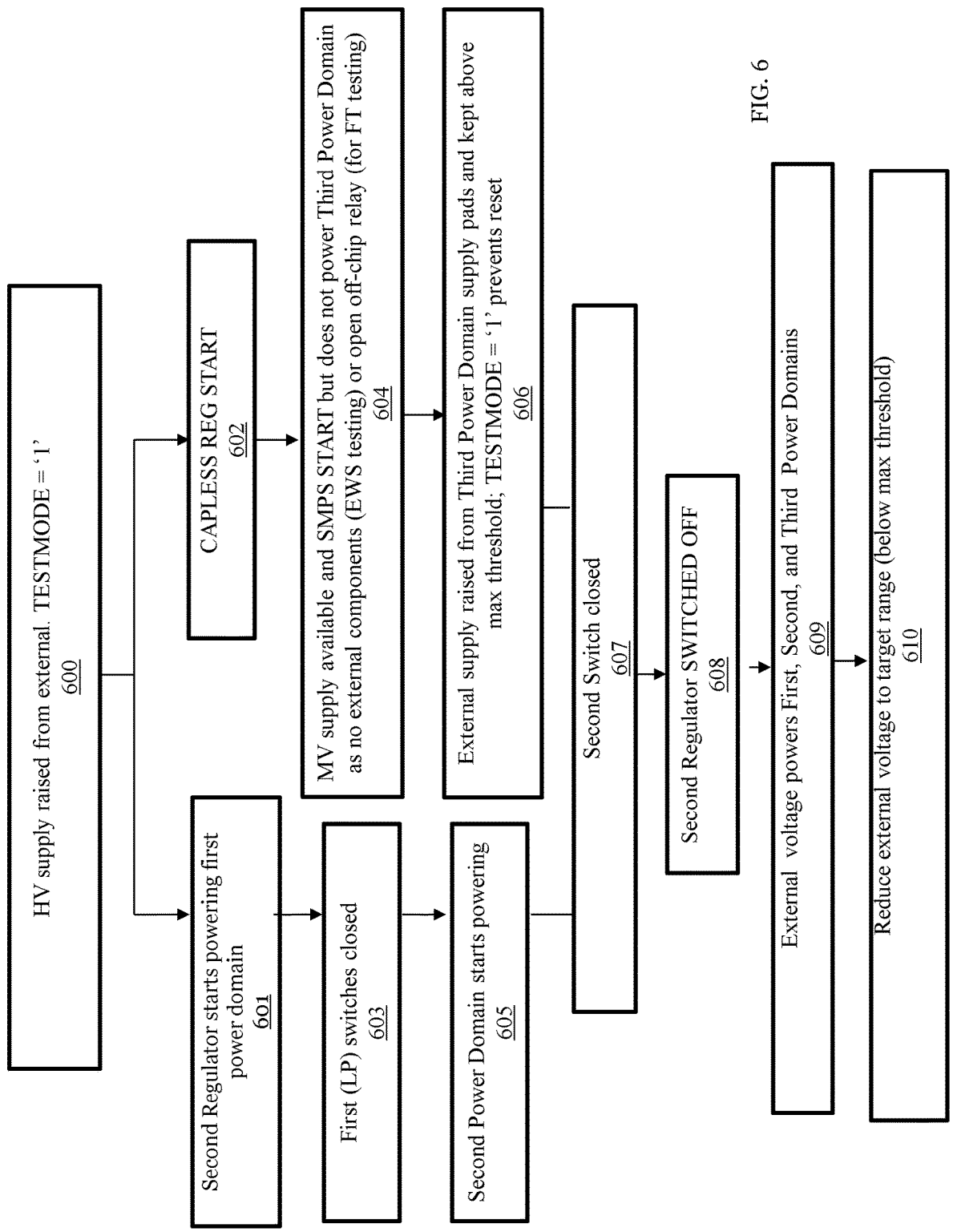
FIG. 6 depicts a sequence to bypass a voltage regulator on a system on a chip of an embodiment.

FIG. 6 depicts a sequence to bypass supply a voltage regulator on a system on a chip for testing of an embodiment at both EWS and FT.

At a step 600, the high voltage supply may be raised from an external voltage source. A test mode pad or pin (pad at EWS [wafer test] and pin at FT [package test]) may be set to a state that indicates that the SOC 1000 is in a production test. For example a TESTMODE signal may be set to "1" in some embodiments. It will be appreciated that a TESTMODE signal may be set to the opposite logic state to the same effect in different embodiments. The test mode pad or pin may be set by a testing operator or engineer. The external voltage supply may be provided by a tester coupled with the SOC 1000.

Like the sequence described with reference to FIG. 3, the sequence may proceed along two parallel paths. On the first path (on the left side of FIG. 6) the steps may be similar or identical to the corresponding steps in described with reference to FIG. 3. At step 601, the second regulator may start powering the first power domain 1002. At a step 603, the first switch 1018 (the low power or "LP" switch or switches) may be closed. This may couple the second power domain 1004 with the second voltage regulator 1010, which may then begin to start powering the second power domain 1004. The second voltage regulator may be powered from the high voltage supply.

Along the second of the parallel paths, at step 602, an internal capless regulator may begin to operate similar to a corresponding step for the sequence described with reference to FIG. 3. A MV voltage supply will become available at step 604. In contrast, to the sequence described with reference to FIG. 3, however, at this point the SMPS 1012 is not powering the third power domain 1006 (for EWS testing). The off chip components needed to close the loop of the SMPS 1012 are not available from a tester during EWS testing. And, during FT testing of a sequence to bypass supply a voltage regulator, a first relay 504 is open to tester setup 502 with off chip components, which prevents the SMPS loop from closing. As a result, the third power domain 1006 will not yet be powered by the SMPS 1012. Rather, the third power domain 1006 is coupled with the device power source.

At a step 606, the voltage of the external supply (for example, provided by a tester) that is coupled with the third power domain may be raised above second voltage regulator max (upper) voltage threshold. This may be beneficial so that when RUN switches (RUN switch 1020, RUN switch 1022, and RUN switch 1024 and additional switches if any) are closed at 607 there is no current flow from second voltage regulator 1010 to device power source 401. But, since second voltage regulator 1010 max threshold or upper limit may be within the upper voltage detector range (for example max threshold/upper limit of second voltage regulator may be 1.03V and upper voltage detector may trip anywhere between 1.026V and 1.154V) there is a possibility of device getting reset when upper voltage detector trips. However, a reset may be prevented because the test mode pad/pin 1036 is asserted which masks the output 1033 of the voltage detector to the reset logic 1034. For example, the TESTMODE signal 1038 and output 1033 from the voltage detector circuit 1032 may ORed together. Thus, by asserting the TESTMODE signal 1038, a reset may be prevented even if output from the voltage detector circuit 1032 is "0."

The paths of the sequence converge at step 607. The SOC may detect that the voltage supply exceeds the second voltage regulator max (upper) threshold and close the RUN switch 1020. The voltage may be detected by a voltage detector circuit 1032. Any additional switches, for example, RUN switch 1022 and RUN switch 1024, that couple the third power domain 1006 with the second power domain 1004 are also closed at step 607. The first power domain 1002 and the second power domain 1004 do not need to be powered from the external supply to close the RUN switches because they are powered from the internal supply at this step. As a result, the first power domain 1002 does not have to be coupled with the external supply. But, after the RUN switches are closed, the domains may be coupled providing pathways for the domains to receive the external voltage supply. At this time, the second voltage regulator 1010 may be switched OFF at step 608. With the RUN switches and first switch 1018 closed, the external voltage supply powers the first power domain 1002, the second power domain 1004, and the third power domain 1006, which may occur at step 609. At a step 610, the external voltage may be reduced below the second voltage regulator max threshold (for example below 1.03 V) to a target level. And, testing may then proceed.

The sequence for bypassing a voltage regulator described with reference to FIG. 6 allows a SOC to be externally powered through the third power domain 1006 without coupling power supply pads of the first power domain 1002 to the external voltage source.

Figure 7:
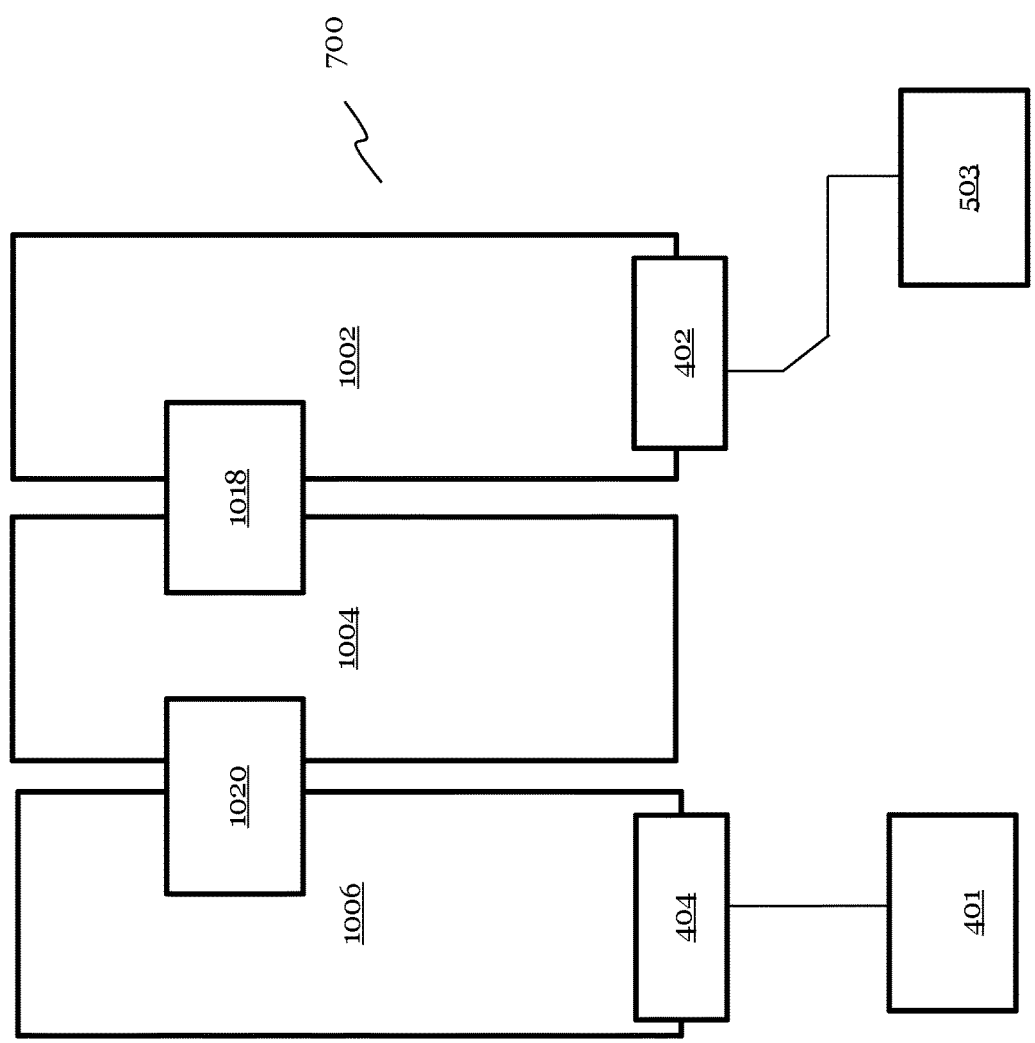
FIG. 7 depicts a system for performing an Electronic Wafer Sort test on a SOC of an embodiment.

FIG. 7 depicts a system 700 for performing an EWS test on a SOC of an embodiment.

The third power domain 1006 of a SOC 1000 may be coupled with a device power source 401 at 404. For EWS, the coupling may be made at the power supply pads 1026 for the third power domain 1006, which may be located in the pad ring 1016 of the SOC 1000. As described with reference to FIG. 6, the first power domain 1002 need not also be coupled to the device power source 401. Instead it may be coupled with test equipment 503. The test equipment may be coupled with the first power domain at 402. For EWS, the coupling may be made at power supply pad 1015 of the first power domain 1002, which may be located in the pad ring 1016.

For EWS testing, coupling the test equipment to the first power domain 1002, rather than coupling the first power domain 1002 to the device power source 401 allows closed loop trimming of the first voltage regulator 1008 and the second voltage regulator 1010. It may also allow load regulation of the first voltage regulator 1008 and the second voltage regulator 1010. And, power switch testing may also be allowed by coupling the test equipment to the first power domain 1002, rather than coupling the first power domain 1002 to the device power source 401. Further, consumption of the first power domain 1002, or the first power domain 1002 and the second power domain 1004 may by checked. Such a test may be checked for consumption on the HV supply.

In various embodiments, the test equipment may comprise Ultraflex Voltage and Current check/forcing equipment. As will be appreciated, test equipment may comprise other types of equipment in various embodiments. The test equipment 503 may be coupled with the first power domain 1002 at node 2005 in FIG. 2. In various embodiments the test equipment may be connected with 0 mA current sink at power-up. The first power domain 1002 may be connected to the test equipment 503 with oma current sink for all test modes where the first power domain 1002 and the second power domain 1004 will be supplied from the external supply such as scan, memory built in self tests ("MBIST") boundary scan, and various analog test modes. The first power domain 1002 may be connected to the test equipment 503 to check voltage for closed loop trimming of the first voltage regulator 1008 and closed loop trimming of the second voltage regulator 1010. During power switch testing, the test equipment 503 may be connected with an appropriate current sink. Likewise, for load regulation of the first voltage regulator 1008 and the second voltage regulator 1010.

Coupling the first power domain 1002 to the device power source 401 also may be advantageous for FT testing once a package has been assembled.

Figure 8:
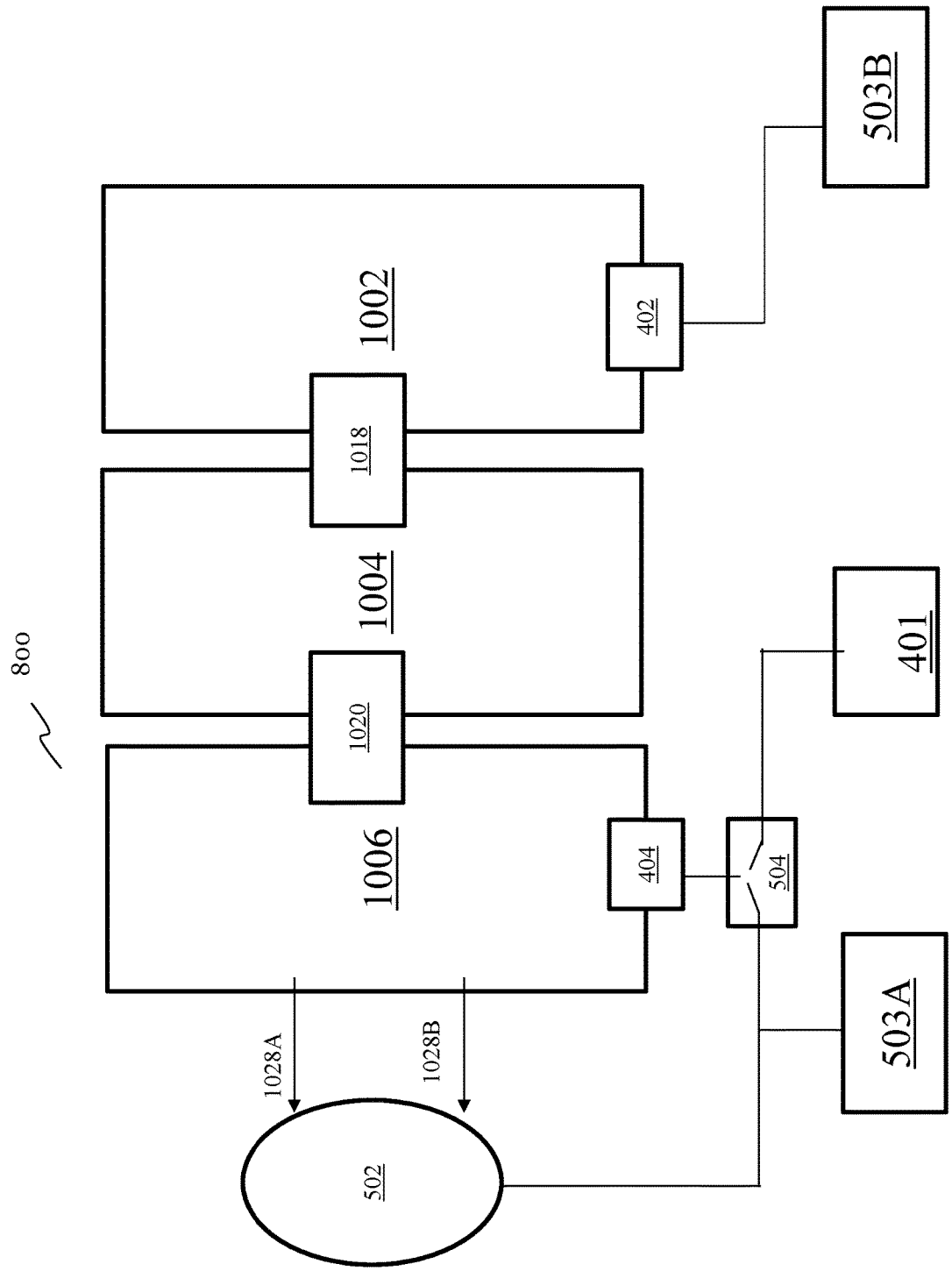
FIG. 8 depicts a system for performing final testing on a SOC after package assembly.

FIG. 8 depicts a system 800 for performing a FT test on a SOC of an embodiment.

In FIG. 8, the device power source 401 is coupled with the third power domain 1006. As a result, the system only comprises one relay, the first relay 504. For FT testing, the coupling of the device power source 401 with the third power domain 1006 may be accomplished through package pin 1029. The elimination of the second relay 506 from the system 800 offers efficiencies over systems for package testing where the external supply voltage is provided through a connection to the first power domain 1002 and the third power domain 1006. This may result in further efficiencies for test equipment that may be used to test multiple SOCs in parallel because one relay may be eliminated for each SOC being tested. For example, if a tester is used to test 32 devices in parallel, 32 relays may be removed.

Raising the voltage level from the third power domain 1006 rather than both the first power domain 1002 and the third power domain 1006 also allows, during FT testing, closed loop trimming of the first voltage regulator 1008 and the second voltage regulator 1010, load regulation of the first voltage regulator 1008 and the second voltage regulator 1010, power switch testing, and consumption testing of the first power domain 1002 or the first power domain 1002 and the second power domain 1004. Note, in various embodiments, that tests referenced in this paragraph may be performed in an external supply mode of a SOC or an internal supply mode of the SOC because off chip components needed to close the SMPS 1012 loop may be provided by the tester setup 502.

For package testing, the test equipment 503A and test equipment 503B may comprise Ultraflex Voltage and Current check/forcing equipment. As will be appreciated, test equipment may comprise other types of equipment in various embodiments. In various embodiments, the teste equipment is connected to 0 mA current sink at power up.

The test equipment 503A may be coupled with the third power domain 1006 at node 2009 in FIG. 2. The test equipment 503B may be coupled with the first power domain 1002 at node 2005 in FIG. 2. For FT testing, the coupling of the device power source 401 with the first power domain 1002 may be accomplished through low voltage supply package pin 1019. In various embodiments the test equipment 503A and test equipment 503B may be connected with 0 ma current sink for test modes where the first power domain 1002 and the second power domain 1004 will be supplied from the external supply such as scan, memory built in self tests ("MBIST") boundary scan, and various analog test modes. The first power domain 1002 may be connected to the test equipment 503B to check voltage for closed loop trimming of the first voltage regulator 1008 and closed loop trimming of the second voltage regulator 1010. The third power domain 1006 may be connected to the test equipment 503A to check voltage for closed loop trimming of the SMPS 1012. During power switch testing, the test equipment 503B may be connected with an appropriate current sink with first power domain 1002 and the test equipment 503A may be connected with a 0 ma current sink to the third power domain 1006. Likewise, for load regulation of the first voltage regulator 1008 and the second voltage regulator 1010 and the test equipment 503A may be connected with a 0 mA current sink to the third power domain 1006. Both test equipment 503A and 503B may be used for current sink on the SMPS. During power switch testing, the test equipment 503B may be connected with an appropriate current sink. Likewise, for load regulation of the first voltage regulator 1008 and the second voltage regulator 1010. And, consumption of the first power domain 1002, or the first power domain 1002 and the second power domain 1004 may by checked. Such a test may be checked for consumption on the HV supply.

To perform a trim on the second voltage regulator 1010 of a SOC, the first power domain 1002, the second power domain 1004, and the third power domain 1006 may all be powered from external supply, which may comprise device power source 401, through power supply pads of the third power domain 1006 at target voltage. The target voltage, in various embodiments, may comprise 0.98 V. The second voltage regulator 1010 may be enabled by test controller 1007, which is a JTAG operation. To avoid current flow from the second voltage regulator 1010 to the device power source 401, the second voltage regulator 1010 may be enabled at less than the target voltage (for example, less than 0.98 V). The RUN switch 1020 (or switches) may be opened by the test controller 1007. The third power domain 1006 will then be powered by the external supply, and trimming may be performed by applying different trim codes through the test controller 1007. After trim, the voltage supply for the second voltage regulator 1010 may be restored to less than the target voltage and the RUN switch (or RUN switches) may be closed by test controller 1007. Load regulation may be performed in same way with appropriate current sink for the test equipment (503 or 503B depending on whether test performed during EWS or FT testing). Consumption on the second power domain 1004 may be tested by measuring the current on the HV supply that powers the second voltage regulator 1010.

To perform a trim on the first voltage regulator 1008 of a SOC 1000, the first power domain 1002, the second power domain 1004, and the third power domain 1006 may all be powered from external supply, which may comprise device power source 401, through power supply pads of the third power domain 1006) at target voltage. The target voltage, in various embodiments, may comprise 0.98 V. The first voltage regulator 1008 may be enabled by test controller 1007, which is a JTAG operation. To avoid current flow from the first voltage regulator 1008 to the device power source 401, the first voltage regulator 1008 may be enabled at less than the target voltage (for example, less than 0.98 V). The first switch 1018 (or switches) may be opened by the test controller 1007. The third power domain 1006 and second power domain 1004 will then be powered by the external supply, and trimming may be performed trim codes through the test controller 1007. After trim, the voltage supply for the first voltage regulator 1008 may be restored to less than the target voltage and the first switch (or switches) may be closed by test controller 1007. Load regulation may be performed in same way with appropriate current sink for the test equipment (503 or 503B depending on whether test performed during EWS or FT testing). Consumption on the first power domain 1002 may be tested by measuring the current on the HV supply that powers the first voltage regulator 1008.

Current detector trim may be performed for a SOC 1000 with the second voltage regulator 1010 turned ON, RUN switch 1020 (or switches) closed, and first switch 1018 (or switches) open. The third power domain 1006 and the second power domain 1004 may, thus, be supplied from the external supply, which may comprise device power source 401, through the power supply pads of the third power domain 1006. Current detector trim operations may then be performed on the closed loop of the second voltage regulator 1010.

For power switch testing, the first power domain 1002, the second power domain 1004, and the third power domain 1006 may all be powered from external supply through power supply pads of the third power domain 1006. An external load (through test equipment) is coupled to the first power domain 1002. One of a plurality of RUN switches that couples the third power domain 1006 with the second power domain 1004 may be closed. And, one of a plurality of switches (for example 1018) that couples the first power domain 1002 to the second power domain 1004 may also be closed. The test controller 1007 may be used to operate the switches. The voltage at the input and output of the closed power switch between the third power domain 1006 and the second power domain 1004 may then be checked. The voltage may be checked on a channel of the tester with a test controller 1007 bit setting. Voltage may also be checked at the power switch closed between the first power domain 1002 and the second power domain 1004. The voltage checked on a channel of the tester with a test controller 1007 bit setting that is different from the bit setting used for the other voltage switch. After the test is complete, all switches coupling the first power domain 1002 and the second power domain 1004 may be closed, and all switches coupling the second power domain 1004 to the third power domain 1006 may be closed.

Figure 9:
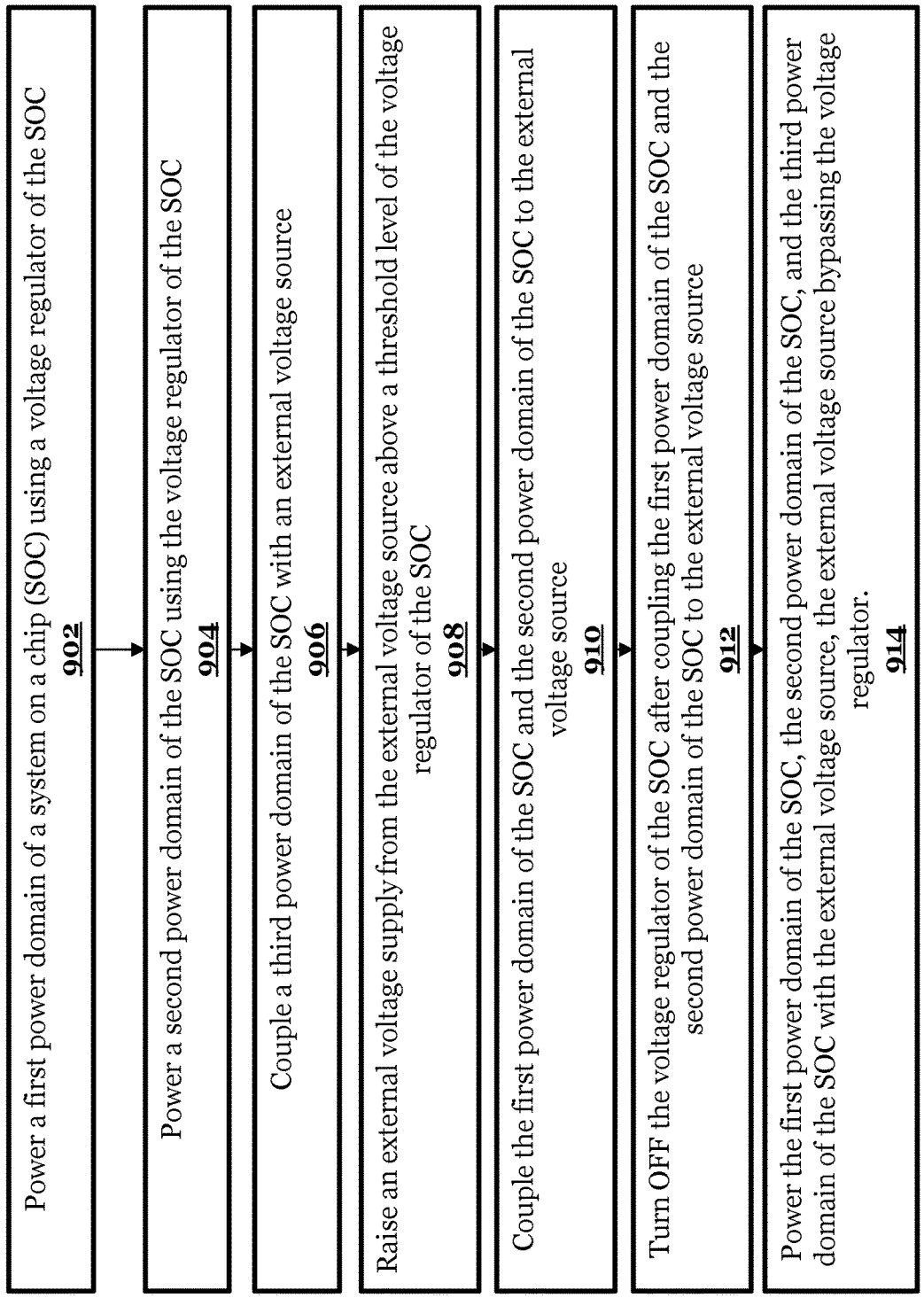
FIG. 9 depicts a flow chart for a method of an embodiment.

FIG. 9 depicts a flow chart for a method 900 of an embodiment.

In various embodiments, the method 900 may comprise at a step 902, powering a first power domain of a system on a chip (SOC) using a voltage regulator of the SOC; at a step 904, powering a second power domain of the SOC using the voltage regulator of the SOC; at a step 906, coupling a third power domain of the SOC with an external voltage source; at a step 908, raising an external voltage supply from the external voltage source above a threshold level of the voltage regulator of the SOC; at a step 910, coupling the first power domain of the SOC and the second power domain of the SOC to the external voltage source; at a step 910, turning OFF the voltage regulator of the SOC after coupling the first power domain of the SOC and the second power domain of the SOC to the external voltage source; and a step 912, powering the first power domain of the SOC, the second power domain of the SOC, and the third power domain of the SOC with the external voltage source, the external voltage source bypassing the voltage regulator.

In various embodiments, the method 900 may further comprise, wherein a RUN switch couples the second power domain of the SOC to the third power domain of the SOC.

In various embodiments, the method 900 may further comprise, wherein the first power domain of the SOC is powered by the external voltage source through a coupling of the first power domain of the SOC and the second power domain of the SOC to the external voltage source by a first switch and through the coupling of the second power domain of the SOC to the third power domain of the SOC by the RUN switch.

In various embodiments, the method 900 may further comprise, wherein powering the second power domain of the SOC using the voltage regulator of the SOC comprises coupling the second power domain of the SOC to the voltage regulator by the first switch.

In various embodiments, the method 900 may further comprise, coupling the SOC to a high voltage power supply used to power the voltage regulator of the SOC while the voltage regulator of the SOC powers the first power domain of the SOC, the second power domain of the SOC, or both.

In various embodiments, the method 900 may further comprise, setting a test-mode pad or a test-mode pin.

In various embodiments, the method 900 may further comprise, wherein the threshold level triggers a reset of the SOC unless the test-mode pad or the test-mode pin is set.

In various embodiments, the method 900 may further comprise, performing a trim operation on the voltage regulator.

In various embodiments, the method 900 may further comprise, performing a load regulation operation for the voltage regulator.

Figure 11:
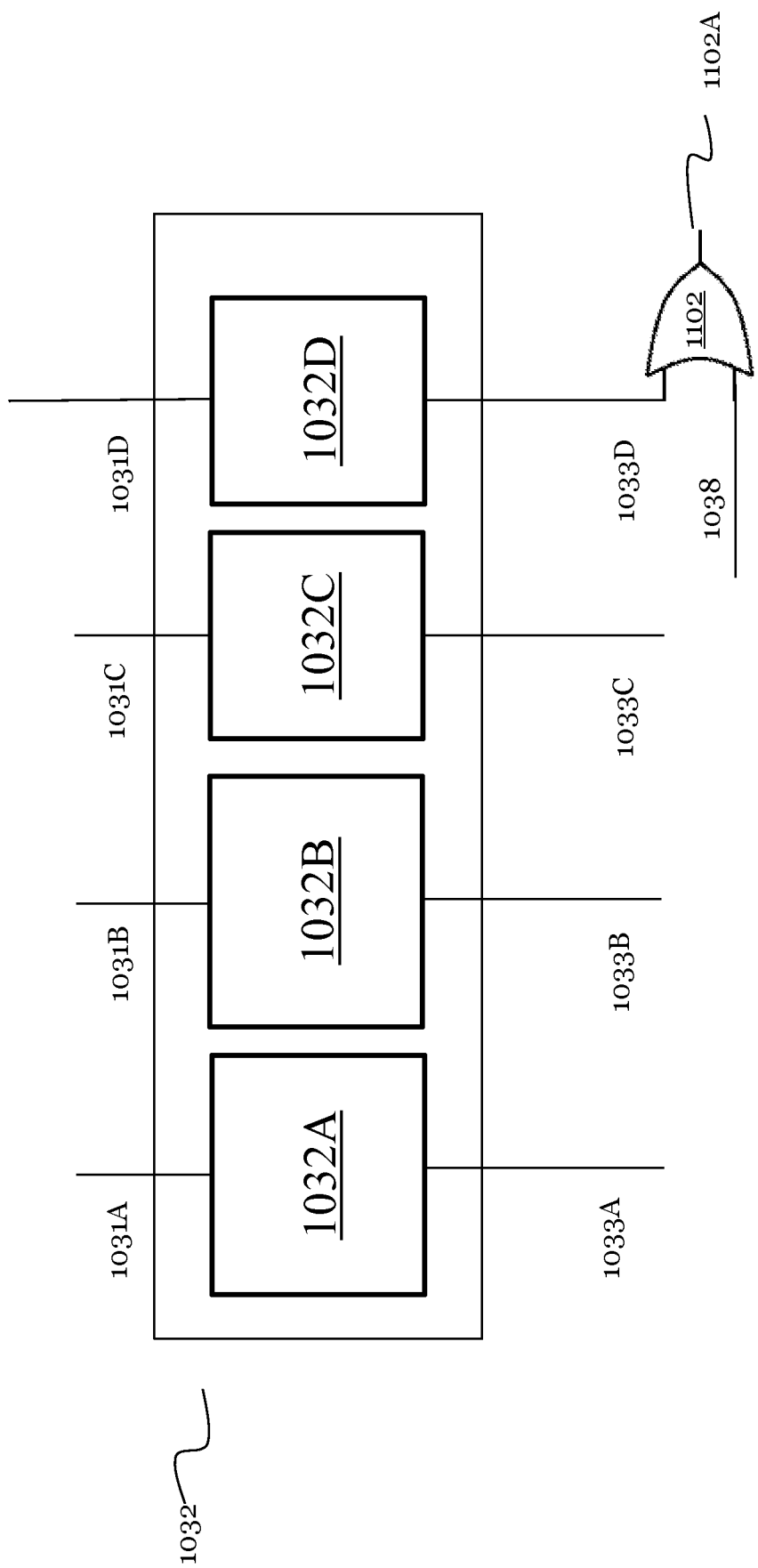
FIG. 11 depicts an embodiment of the voltage detector circuit with output masked by a TESTMODE signal.

FIG. 11 depicts an embodiment of the voltage detector circuit 1032 with output masked by a TESTMODE signal.

An OR gate 1102 may receive the output 1033D from the upper voltage detector 1032D. The OR gate may also receive TESTMODE signal 1038. The OR gate can thus mask the output of the upper voltage detector 1032D. The output 1102A of the OR gate may be coupled with reset logic 1034.

Example 1. A method including powering a first power domain of a system on a chip (SOC) using a voltage regulator of the SOC; powering a second power domain of the SOC using the voltage regulator of the SOC; coupling a third power domain of the SOC with an external voltage source; raising an external voltage supply from the external voltage source above a threshold level of the voltage regulator of the SOC; coupling the first power domain of the SOC and the second power domain of the SOC to the external voltage source; turning OFF the voltage regulator of the SOC after coupling the first power domain of the SOC and the second power domain of the SOC to the external voltage source; and powering the first power domain of the SOC, the second power domain of the SOC, and the third power domain of the SOC with the external voltage source, the external voltage source bypassing the voltage regulator.

Example 2. The method of Example 1, wherein a RUN switch couples the second power domain of the SOC to the third power domain of the SOC.

Example 3. The methods of Example 1 or Example 2, wherein the first power domain of the SOC is powered by the external voltage source through a coupling of the first power domain of the SOC and the second power domain of the SOC to the external voltage source by a first switch and through the coupling of the second power domain of the SOC to the third power domain of the SOC by the RUN switch.

Example 4. The methods of Example 1 to Example 3, wherein powering the second power domain of the SOC using the voltage regulator of the SOC includes coupling the second power domain of the SOC to the voltage regulator by the first switch.

Example 5. The methods of Example 1 to Example 4, further including coupling the SOC to a high voltage power supply used to power the voltage regulator of the SOC while the voltage regulator of the SOC powers the first power domain of the SOC, the second power domain of the SOC, or both.

Example 6. The methods of Example 1 to Example 5, further including setting a test-mode pad or a test-mode pin.

Example 7. The methods of Example 1 to Example 6, wherein the threshold level triggers a reset of the SOC unless the test-mode pad or the test-mode pin is set.

Example 8. The methods of Example 1 to Example 7, further including, performing a trim operation on the voltage regulator.

Example 9. The methods of Example 1 to Example 8, further including, performing a load regulation operation for the voltage regulator.

Example 10. A system on a chip (SOC) including a voltage regulator; a first power domain configured to receive power from the voltage regulator; a second power domain; a third power domain configured to receive power from an external voltage supply coupled to the SOC; a first switch is configured to couple the first power domain to the second power domain when the first power domain is powered; a RUN switch that is configured to couple the second power domain to the third power domain when the second power domain and the third power domain are powered, the voltage regulator being configured to shut OFF when the run switch couples the second power domain to the third power domain; a voltage detector configured to trigger a reset of the SOC when a voltage-level signal for the third power domain exceeds the a maximum threshold level for the voltage regulator; and a test-mode pad or a test-mode pin that masks the reset when the test-mode pad or the test-mode pin is asserted.

Example 11. The SOC of example 10, further including a pad ring including a first set of pads configured to couple the third power domain to the external voltage supply.

Example 12. The SOC of Example 10 or Example 11, further including wherein the pad ring further includes a second set of pads, the second set of pads being configured to couple the first power domain with test equipment.

Example 13. The SOC of Example 10 to Example 12, further including a switched mode power supply configured to receive an internal medium voltage supply to power the first power domain, the second power domain, and the third power domain when the external voltage supply is unavailable, the first switch is closed, and the RUN switch is closed.

Example 14. The SOC of Example 10 to Example 13, further including, wherein the voltage regulator is config-ured to receive an external high voltage supply to power the first power domain and the second power domain.

Example 15. The SOC of Example 10 to Example 14, further including, a first voltage regulator configured to receive an external high voltage supply and power the first power domain during a standby mode of the SOC.

Example 16. The SOC of Example 10 to Example 15, further including, a test controller, configured to operate the RUN switch and the first switch during to perform test operations on the SOC.

Example 17. The SOC of Example 10 to Example 16, further including, wherein the test operations include closed loop trimming, power switch testing, or current detector trimming.

Example 18. A testing system including: a device power source; a tester; and a system on a chip (SOC). The SOC including a voltage regulator; a first power domain configured to receive power from the voltage regulator, the first power domain being coupled with the tester; a second power domain; a third power domain configured to receive power from the device power source; a first switch is configured to couple the first power domain to the second power domain when the first power domain is powered; a RUN switch that is configured to couple the second power domain to the third power domain when the second power domain and the third power domain are powered, the voltage regulator being configured to shut OFF when the run switch couples the second power domain to the third power domain; a voltage detector configured to trigger a reset of the SOC when a voltage-level signal for the third power domain exceeds the a maximum threshold level for the voltage regulator; and a test-mode pad or a test-mode pin that masks the reset when the test-mode pad or the test-mode pin is asserted.

Example 19. The testing system of Example 18, wherein the SOC include a pad ring including a first set of pads configured to couple the third power domain to the device power source.

Example 120. The testing system of Example 18 or Example 19, wherein the pad ring further includes a second set of pads, the second set of pads being configured to couple the first power domain with the tester.

Example 21. The testing system of Example 18 to Example 20, further including a test controller, configured to operate the RUN switch and the first switch during to perform test operations on the SOC.

Example 22. The testing system of Example 18 to Example 21, wherein the test operations include closed loop trimming, power switch testing, or current detector trimming.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method comprising:
powering a first power domain of a system on a chip (SOC) using a voltage regulator of the SOC;
powering a second power domain of the SOC using the voltage regulator of the SOC;
coupling a third power domain of the SOC with an external voltage source;

raising an external voltage supply from the external voltage source above a threshold level of the voltage regulator of the SOC;

coupling the first power domain of the SOC and the second power domain of the SOC to the external voltage source;

turning OFF the voltage regulator of the SOC after coupling the first power domain of the SOC and the second power domain of the SOC to the external voltage source; and powering the first power domain of the SOC, the second power domain of the SOC, and the third power domain of the SOC with the external voltage source, the external voltage source bypassing the voltage regulator.

2. The method of claim 1, wherein a RUN switch couples the second power domain of the SOC to the third power domain of the SOC.

3. The method of claim 2, wherein the first power domain of the SOC is powered by the external voltage source through a coupling of the first power domain of the SOC and the second power domain of the SOC to the external voltage source by a first switch and through the coupling of the second power domain of the SOC to the third power domain of the SOC by the RUN switch.

4. The method of claim 3, wherein powering the second power domain of the SOC using the voltage regulator of the SOC comprises coupling the second power domain of the SOC to the voltage regulator by the first switch.

5. The method of claim 1, further comprising coupling the SOC to a high voltage power supply used to power the voltage regulator of the SOC while the voltage regulator of the SOC powers the first power domain of the SOC, the second power domain of the SOC, or both.

6. The method of claim 1, further comprising setting a test-mode pad or a test-mode pin.

7. The method of claim 6, wherein the threshold level triggers a reset of the SOC unless the test-mode pad or the test-mode pin is set.

8. The method of claim 1, further comprising, performing a trim operation on the voltage regulator.

9. The method of claim 1, further comprising, performing a load regulation operation for the voltage regulator.

10. A system on a chip (SOC) comprising:
a voltage regulator;
a first power domain configured to receive power from the voltage regulator;
a second power domain;
a third power domain configured to receive power from an external voltage supply coupled to the SOC;
a first switch is configured to couple the first power domain to the second power domain when the first power domain is powered;
a RUN switch that is configured to couple the second power domain to the third power domain when the second power domain and the third power domain are powered, the voltage regulator being configured to shut OFF when the run switch couples the second power domain to the third power domain;
a voltage detector configured to trigger a reset of the SOC when a voltage-level signal for the third power domain exceeds a maximum threshold level for the voltage regulator; and
a test-mode pad or a test-mode pin that masks the reset when the test-mode pad or the test-mode pin is asserted.

11. The SOC of claim 10, further comprising a pad ring comprising a first set of pads configured to couple the third power domain to the external voltage supply.

12. The SOC of claim 11, wherein the pad ring further comprises a second set of pads, the second set of pads being configured to couple the first power domain with test equipment.

13. The SOC of claim 10, further comprising a switched mode power supply configured to receive an internal medium voltage supply to power the first power domain, the second power domain, and the third power domain when the external voltage supply is unavailable, the first switch is closed, and the RUN switch is closed.

14. The SOC of claim 10, wherein the voltage regulator is configured to receive an external high voltage supply to power the first power domain and the second power domain.

15. The SOC of claim 10, further comprising a first voltage regulator configured to receive an external high voltage supply and power the first power domain during a standby mode of the SOC.

16. The SOC of claim 10, further comprising a test controller, configured to operate the RUN switch and the first switch during to perform test operations on the SOC.

17. The SOC of claim 16, wherein the test operations comprise closed loop trimming, power switch testing, or current detector trimming.

18. A testing system comprising:
a device power source;
a tester; and
a system on a chip (SOC) comprising:
a voltage regulator;
a first power domain configured to receive power from the voltage regulator, the first power domain being coupled with the tester;
a second power domain;
a third power domain configured to receive power from the device power source;
a first switch is configured to couple the first power domain to the second power domain when the first power domain is powered;
a RUN switch that is configured to couple the second power domain to the third power domain when the second power domain and the third power domain are powered, the voltage regulator being configured to shut OFF when the run switch couples the second power domain to the third power domain;
a voltage detector configured to trigger a reset of the SOC when a voltage-level signal for the third power domain exceeds a maximum threshold level for the voltage regulator; and
a test-mode pad or a test-mode pin that masks the reset when the test-mode pad or the test-mode pin is asserted.

19. The testing system of claim 18, wherein the SOC comprises a pad ring comprising a first set of pads configured to couple the third power domain to the device power source.

20. The testing system of claim 19, wherein the pad ring further comprises a second set of pads, the second set of pads being configured to couple the first power domain with the tester.

21. The testing system of claim 18, further comprising a test controller, configured to operate the RUN switch and the first switch to perform test operations on the SOC.

22. The testing system of claim 21, wherein the test operations comprise closed loop trimming, power switch testing, or current detector trimming.

* * * * *

UNITED STATES PATENT AND TRADEMARK OFFICE
CERTIFICATE OF CORRECTION

| | |
|---|---|
| PATENT NO. | : 11,550,348 B2 |
| APPLICATION NO. | : 17/211545 |
| DATED | : January 10, 2023 |
| INVENTOR(S) | : Venkata Narayanan Srinivasan |

It is certified that error appears in the above-identified patent and that said Letters Patent is hereby corrected as shown below:

In the Claims

Claim 16, Column 20, Line 21; delete "during".

Signed and Sealed this
Seventh Day of February, 2023

Katherine Kelly Vidal
*Director of the United States Patent and Trademark Office*